United States Patent
Poulsen et al.

(10) Patent No.: US 10,110,181 B2
(45) Date of Patent: Oct. 23, 2018

(54) CLASS-D AMPLIFIER WITH POST FILTER FEEDBACK LOOP

(71) Applicant: TEXAS INSTRUMENTS INCORPORATED, Dallas, TX (US)

(72) Inventors: Søren Bang Poulsen, Måløv (DK); Kim Nordtorp Madsen, Skovlunde (DK)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/423,093

(22) Filed: Feb. 2, 2017

(65) Prior Publication Data

US 2018/0191315 A1   Jul. 5, 2018

Related U.S. Application Data

(60) Provisional application No. 62/440,523, filed on Dec. 30, 2016.

(51) Int. Cl.
   *H03F 3/217* (2006.01)
   *H03F 3/185* (2006.01)
   *H03F 1/32* (2006.01)

(52) U.S. Cl.
   CPC ......... *H03F 3/2171* (2013.01); *H03F 1/3205* (2013.01); *H03F 3/185* (2013.01); *H03F 3/217* (2013.01); *H03F 3/2173* (2013.01); *H03F 2200/03* (2013.01); *H03F 2200/351* (2013.01); *H03F 2200/391* (2013.01)

(58) Field of Classification Search
   CPC ... H03F 1/04; H03F 1/34; H03F 3/217; H03F 3/2171; H03F 3/2173; H03F 2200/351; H03F 2200/432; H03F 2200/78; H03F 3/38; H03M 1/504; H03M 1/822

USPC ....................................... 330/10, 207 A, 251
See application file for complete search history.

(56) References Cited

U.S. PATENT DOCUMENTS 6,297,692 B1 * 10/2001 Nielsen ................... H03F 1/083
                                                                330/10
6,552,606 B1 *  4/2003 Veltman ................ H03F 3/2171
                                                                330/10

(Continued)

FOREIGN PATENT DOCUMENTS

JP         2010157970         7/2010

OTHER PUBLICATIONS

International Search Report in corresponding PCT Application No. PCT/US2017/068951, dated Apr. 26, 2018 (2 pages).

*Primary Examiner* — Khahn V Nguyen
(74) *Attorney, Agent, or Firm* — John R. Pessetto; Charles A. Brill; Frank D. Cimino

(57) ABSTRACT

A fixed frequency class-D audio amplifier includes the L-C output filter in a high order feedback loop. An audio amplifier integrated circuit includes an output driver, an output terminal, a first input terminal, a second order filter, and a summing amplifier. The output driver is configured to drive a speaker coil through an L-C filter. The output terminal is to couple the output driver to an input side of the L-C filter. The first input terminal is to couple an output side of the L-C filter to the integrated circuit. The second order filter includes a first filter stage, and a second filter stage coupled to an output of the first filter stage. The summing amplifier includes a first input coupled to the first input terminal, and a second input coupled to an output of the second filter stage.

18 Claims, 4 Drawing Sheets

(56) References Cited

U.S. PATENT DOCUMENTS

| | | | |
|---|---|---|---|
| 7,023,253 B2 * | 4/2006 | Huang | H02M 3/1588 |
| | | | 327/172 |
| 7,183,823 B2 * | 2/2007 | Gibson | H03F 3/217 |
| | | | 327/170 |
| 7,221,216 B2 * | 5/2007 | Nguyen | H03F 1/32 |
| | | | 330/10 |
| 9,362,813 B2 * | 6/2016 | Hu | H02M 1/00 |
| 2007/0057721 A1 | 3/2007 | Risbo et al. | |
| 2008/0297244 A1 | 12/2008 | Poulsen et al. | |
| 2015/0288335 A1 | 10/2015 | Hoyerby | |
| 2016/0204751 A1 | 7/2016 | Kinyua et al. | |

* cited by examiner

CLASS-D AMPLIFIER WITH POST FILTER FEEDBACK LOOP

CROSS REFERENCE TO RELATED APPLICATION(S)

This application claims priority to and the benefit of U.S. Provisional Patent Application No. 62/440,523, filed Dec. 30, 2016, which application is incorporated herein by reference.

BACKGROUND

Class-D audio amplifiers are switch mode amplifiers that switch at a high frequency to produce a rectangular waveform at the amplifier's output. Class-D amplifiers may be much more efficient than linear audio amplifiers, and as a result may employ smaller power supplies and eliminate heat sinks. Accordingly, class-D amplifiers may significantly reduce overall system costs, size, and weight relative to linear amplifiers of equivalent power.

Some class-D amplifiers use a pulse width modulator (PWM) to generate pulses that vary in width with the audio signal's amplitude. The pulses may switch output transistors of the amplifier at a fixed or variable frequency. Some class-D amplifiers may rely upon other types of pulse modulators, such as pulse density modulators. The rectangular waveform generated by the class-D amplifier is filtered to remove the high-frequency carrier waveform and reconstruct the audio waveform, which can be used to drive a speaker and produce sound.

SUMMARY

A fixed frequency class-D audio amplifier that includes the L-C output filter in a high order feedback loop is disclosed herein. In one embodiment, a class-D amplifier includes an L-C filter; an output driver, a second order filter, and a summing amplifier. An output terminal of the output driver is coupled to an input terminal of the L-C filter. A first input terminal of the summing amplifier is coupled to an output terminal of the L-C filter. A second input terminal of the summing amplifier is coupled to a first output terminal of the second order filter.

In another embodiment, an audio amplifier integrated circuit includes an output driver, an output terminal, a first input terminal, a second order filter, and a summing amplifier. The output driver is configured to drive a speaker coil through an L-C filter. The output terminal is to couple the output driver to an input side of the L-C filter. The first input terminal is to couple an output side of the L-C filter to the integrated circuit. The second order filter includes a first filter stage, and a second filter stage coupled to an output of the first filter stage. The summing amplifier includes a first input coupled to the first input terminal, and a second input coupled to an output of the second filter stage.

In a further embodiment, an integrated circuit includes a class-D audio amplifier. The class-D audio amplifier includes an output driver, an output terminal, a first input terminal, a second order filter, a summing amplifier, and a differentiator. The output driver is configured to drive a speaker coil through an L-C filter. The output terminal is to couple the output driver to an input side of the L-C filter. The first input terminal is to couple an output side of the L-C filter to the integrated circuit. The second order filter includes a first filter stage coupled to the first input terminal, and a second filter stage coupled to an output of the first filter stage. The summing amplifier includes a first input coupled to the first input terminal, and a second input coupled to an output of the second filter stage. The differentiator is coupled to the first input terminal and to a third input of the summing amplifier.

BRIEF DESCRIPTION OF THE DRAWINGS

For a detailed description of various examples, reference will now be made to the accompanying drawings in which.

DETAILED DESCRIPTION

Figure 1:
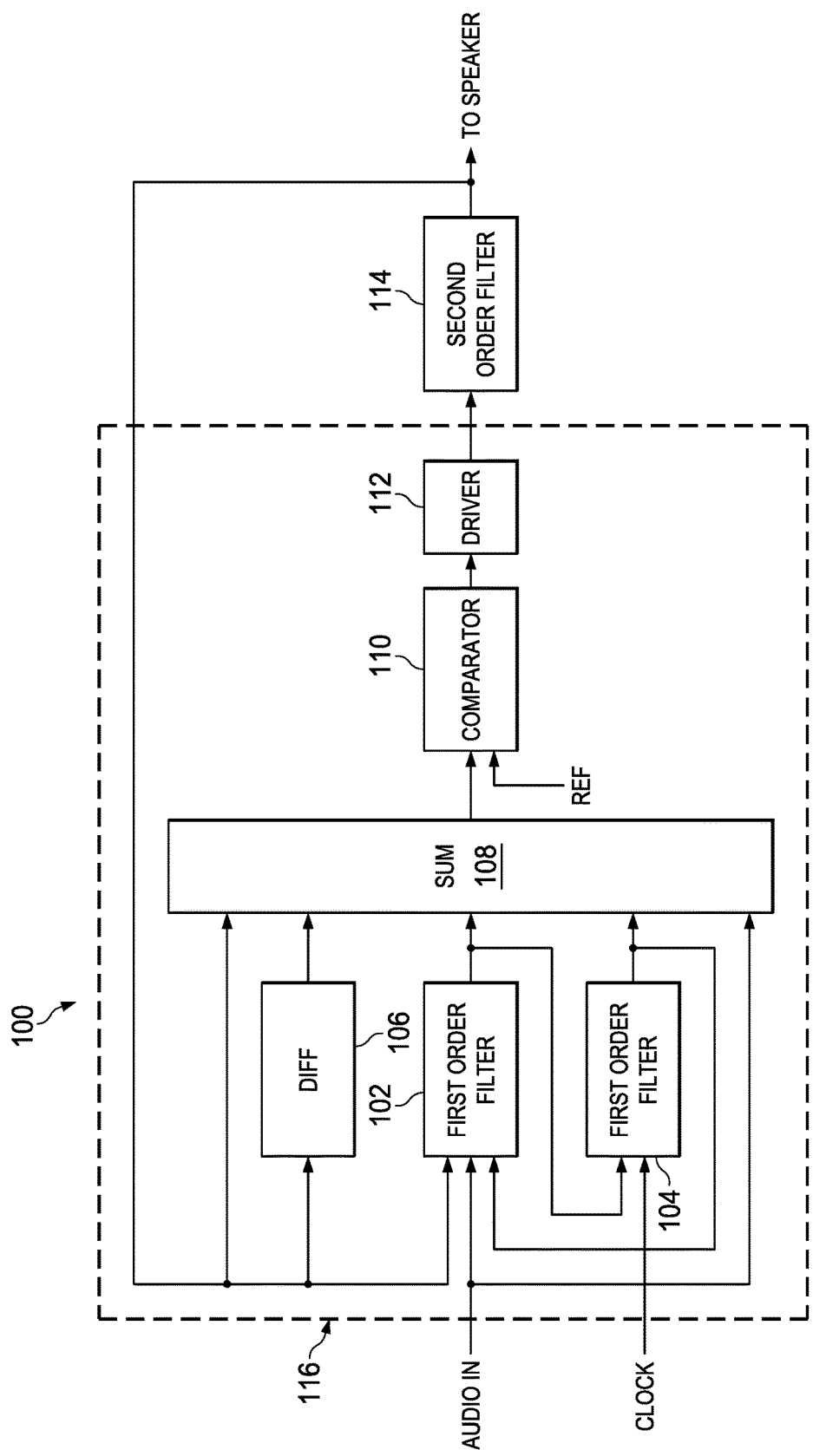
FIG. 1 shows a block diagram for a class-D audio amplifier in accordance with various embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections.

Class-D amplifiers use feedback loops to improve Total Harmonic Distortion (THD). For example, a strong feedback loop with large open loop gain in the audio band may provide good THD performance. For closed loop stability the open loop gain of a fixed switching frequency class-D amplifier should be limited to 0 decibels at ~⅓ of the switching frequency. A fixed switching frequency may be in the 400-600 kHz range which is quite close to the upper audio band of 20 kilohertz (kHz) (or up to or greater than 40 kHz in some applications). Thus, limiting the loop gain to ~⅓ of the switching frequency may compromise available feedback gain at the higher audio frequencies due to closed loop stability criteria. A self-oscillating class-D amplifier has a stability criteria of 0 dB at approximately the switching frequency which is beneficial to achieving high open loop gain at high audio frequencies, but self-oscillation is impractical for monolithic integration of multiple audio channels due to the switching frequency of each audio channel varying with the output level.

The amount THD improvement provided by a feedback loop depends on the linearity of the modulation which in turn depends on the high frequency content (residuals of the switching frequency and its harmonics). Most conventional class-D amplifier designs employ a "brute force" approach, using high open loop gain, to achieve low THD levels, without much attention to the loop filter shaping (to get a linear PWM modulation). Such an approach often results in good 1 kHz THD but only mediocre high frequency THD performance. Embodiments of the class-D amplifier disclosed herein include a loop filter shaped for high PWM linearity, and thereby provide better THD performance at an equivalent loop gain, or allow the open loop gain requirements to be relaxed while providing equivalent THD performance relative to conventional integrated class-D audio amplifiers.

Most class-D amplifiers exclude the output filter from the feedback loop, or only include the output filter in extra, weak loop. It is desirable and advantageous to include the L-C filter in the feedback loop to suppress errors from the inductor core and output capacitor both for performance enhancement and for reduced system cost (e.g., to allow use of less expensive L-C filter components). Embodiments of the class-D amplifier disclosed herein include the output filter in the feedback loop. Conventional class-D amplifiers often require Zobel networks, resistor-capacitor filters from the speaker terminals to ground, for open load stability in amplifiers with the L-C filter in the feedback loop. Such power dissipating components add cost to the amplifier design. Embodiments of the class-D amplifier disclosed herein provide open load stability without Zobel networks.

Conventional class-D amplifiers using a fixed switching frequency are generally unable to provide THD performance better than 0.001% over the entire audio band. Embodiments of the class-D amplifier disclosed herein may provide better than 0.001% THD performance while using a fixed switching frequency and including the output filter in the feedback loop. Because the class-D amplifiers disclosed herein use a fixed switching frequency, embodiments are well suited for monolithic integration.

FIG. 1 shows a block diagram for a class-D audio amplifier 100 in accordance with various embodiments. The class-D amplifier 100 includes a first-order filter 102, a first-order filter 104 cascaded with the first order filter 102 to form a second order filter, a differentiator 106, a summation circuit 108, a comparator 110, a driver 112, and a second-order output filter 114. In various embodiments, the first-order filter 102, the first-order filter 104, the differentiator 106, the summation circuit 108, the comparator 110, and the driver 112 may be embodied in an integrated circuit.

The output of the comparator 110 is a switching signal (e.g., a PWM switching signal) that turns the driver 112 on or off. The driver 112 may connect the second-order output filter 114 to a first voltage responsive to assertion of the output signal of the comparator 110 and connect the second-order output filter 114 to a second voltage responsive to negation of the output signal of the comparator 110. The comparator 110 is coupled to the summation circuit 108, and compares the output of the summation circuit 108 to a reference voltage. The comparator 110 may assert an output signal responsive to the reference voltage exceeding the output voltage of the summation circuit 108, and negate the output signal responsive to the reference voltage not exceeding the output voltage of the summation circuit 108. In some examples, the comparator 110 may assert the output signal by causing the output signal to transition to a first logic state (e.g., logic "1", and may negate the output signal by causing the output signal to transition to a second logic state (e.g., logic "0").

The summation circuit 108 combines a number of different signals to produce the input to the comparator 110. The summation circuit 108 is coupled to an audio input of the class-D amplifier 100 to receive the audio input signal. Thus, the summation circuit 108 receives the unfiltered audio input signal. The summation circuit 108 is also coupled to the output of the second order output filter 114. Thus, the summation circuit 108 receives the second order filtered output of the driver 112. The output of the second order output filter 114 is also coupled to the differentiator 106. The differentiator 106 differentiates the output of the second order output filter 114 to produce an output that approximates a first order filtered version of the output of the driver 112. That is, the differentiator provides increasing gain with frequency to increase the amplitude of higher frequency signals attenuated by the second order output filter 114. Thus, the output of the differentiator may approximate the high frequency content of a signal produced by a first order filter coupled to the output of the driver 112. Low frequency output of the differentiator need not be comparable to the low frequency output of a first order filter because, in the summation circuit 108, the low frequency content is provided by the direct output of the second order filter 114 in addition to the outputs of the filters 102 and 104. The differentiator 106 is coupled to the summation circuit 108 to provide the first order filtered version of the output of the driver 112 to the summation circuit 108. In some embodiments, the differentiator 106 may be replaced by a first order low-pass filter coupled to the output of the driver 112.

The output of the second order output filter 114 is also coupled to the first order filter 102. The first order filter 102 is coupled to the audio input of the class-D amplifier 100 to receive the audio input signal, and is coupled to the output of the first order filter 104. The output of the first order filter 102 includes third order filtered output of the driver 112. The output of the first order filter 102 is coupled to an input of the summation circuit 108, and to an input of the first order filter 104.

The first order filter 104 also receives as input the fixed frequency clock signal that defines the PWM timing for the class-D amplifier 100. The first order filter 104 produces as output a fourth order filtered version of the output of the driver 104. The output of the first order filter 104 is coupled to the summation circuit 108.

Thus, the summation circuit 108 combines unfiltered audio input with first, second, third, and fourth order filtered feedback of the output of the driver 112. The first, second, third, and fourth order filtered feedback are derived from the output of the second order output filter 114.

Figure 2:
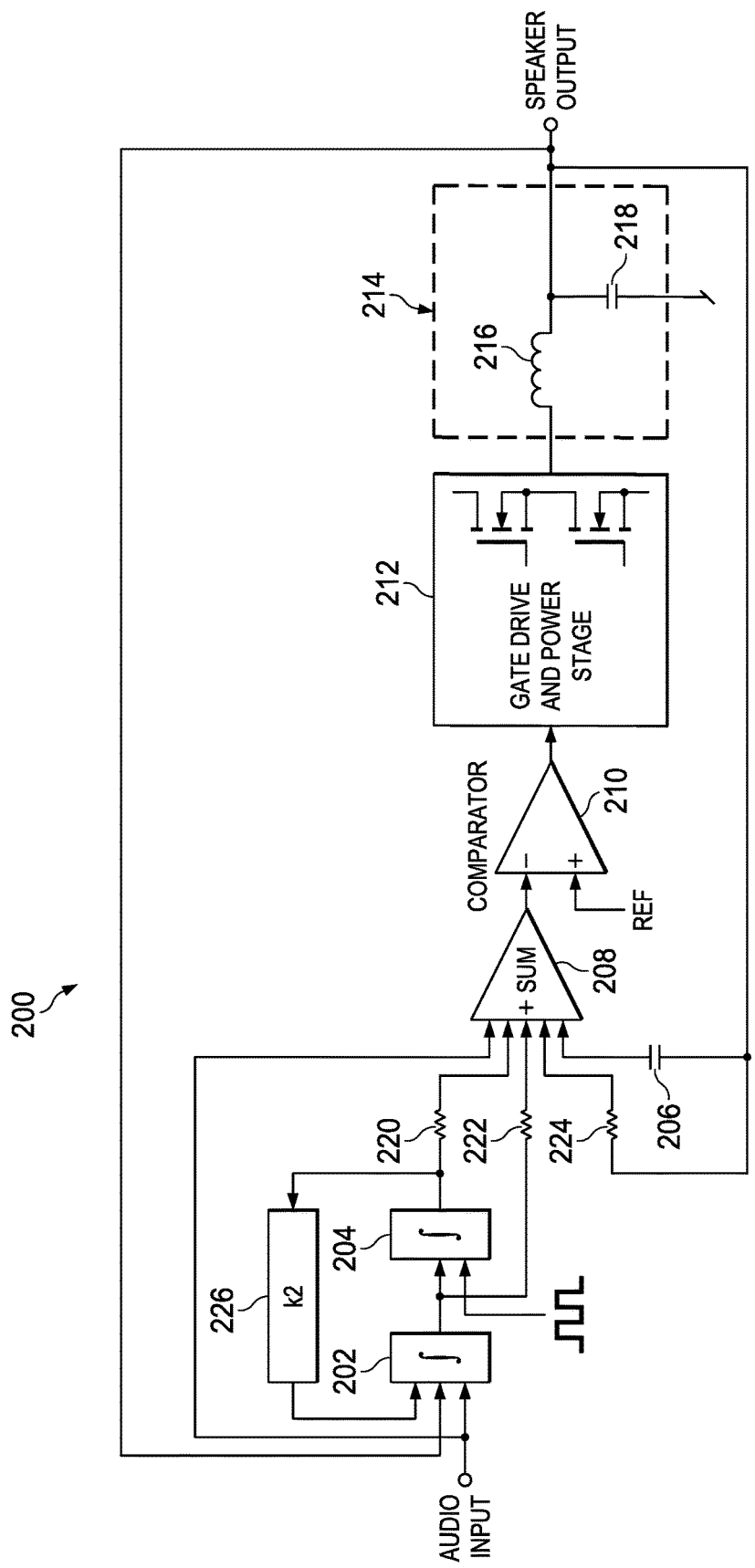
FIG. 2 shows a schematic level diagram for a class-D audio amplifier in accordance with various embodiments.

FIG. 2 shows a schematic level diagram for a class-D audio amplifier 200 in accordance with various embodiments. The amplifier 200 is an embodiment of the amplifier 100 of FIG. 1. The class-D amplifier 200 includes an integrator 202 (i.e., a first filter stage), an integrator 204 (i.e., a second filter stage) cascaded with the integrator 202 to form a second order filter, a summing amplifier 208, a comparator 210, a driver 212, and an output filter 214. In various embodiments, the integrator 202, the integrator 204, the summing amplifier 208, the comparator 210, and the driver 212 may be embodied in an integrated circuit.

The output filter 214 includes an inductor 216 and a capacitor 218 coupled to the inductor 216 (i.e., the output filter 214 is an L-C filter). The input terminal of the inductor 216 is coupled to the output of the driver 212 (i.e., to an output terminal of the driver 212). The output terminal of the inductor 214 is coupled to the capacitor 218 and can be connected to a speaker. The driver 212 may include a power stage that includes power stage output transistors arranged in a push-pull configuration to drive the output filter 214. The transistors may be, for example, power metal oxide semiconductor transistors (MOSFETs). The driver 212 may also include circuitry (e.g., gate drive circuitry) to drive the control terminals of the transistors, e.g., circuitry to drive the gate capacitance of the power MOSFETs.

The comparator 210 is coupled to the driver 212 and to the summing amplifier 208. The comparator 210 compares the output of the summing amplifier 208 to a reference voltage. The output of the comparator 210 switches the output transistors of the driver 212 on and off. The output of the comparator 210 may be a pulse width modulated signal.

In the class-D amplifier 200, the output filter 214, the integrators 202, 204, and summing amplifier 208 operate to provide a high-order (e.g., fourth order) feedback loop. The output terminal of the output filter 214 is coupled to the summing amplifier 208 and to the integrator 202 (e.g., via an input terminal of an integrated circuit embodying the integrated components of the class-D amplifier 200). The output filter 214 is a second order filter. The output of the filter 214 is scaled via the resistor 224 and input to the summing amplifier 208. The output of the filter 214 is also differentiated via the capacitor 206 to provide a first order filtered version of the output of the driver 212. Thus, the inputs to the summing amplifier 208 include first and second order filtered versions of the output of the driver 212 provided from the second order filter 214. The passive loop formed by feedback of the first and second order filtered output of the driver 212 can be stable and used to facilitate recovery from saturation of the integrators 202, 204.

The audio input signal amplified by the class-D amplifier 200 is provided to the summing amplifier 208 and to the integrator 202. By feeding the audio input forward to the summing amplifier 208, the loop filter need only provide error suppression while allowing for optimization of voltage swing and capacitor size in the integrators 202, 204. The integrator 202 combines the audio input signal with the second order filtered output of the driver 212 received from the output filter 214 and the output of the integrator 204 to produce a third order filtered output signal that is provided to the summing amplifier 208. The output of the integrator 202, as provided to the summing amplifier 208, is scaled by resistor 222.

The integrator 204 combines the output of the integrator 202 with a clock signal to produce a fourth order filtered version of the output of the driver 212. The output of the integrator 204 is provided to the summing amplifier 208 and to the integrator 202. The output of the integrator 204, as provided to the summing amplifier 208, is scaled by resistor 220. Feedback circuitry 226 couples the output of the integrator 204 to the input of the integrator 202 and may include components to control the amplitude and frequency of the signals fed back to the integrator 202. The clock signal provided to the integrator 204 may be fixed frequency clock signal that sets the pulse width modulation frequency of the class-D amplifier 200. Generally, the frequency of the clock signal is not restricted to any particular range. In some embodiments, the frequency of the clock signal may be less than 1 megahertz (e.g., 600 kilohertz, 750 kilohertz, etc.). In some embodiments, the frequency of the clock signal may be greater than 1 megahertz (e.g., greater than 2 megahertz to avoid AM band interference). In some embodiments, the clock signal may be modulated to implement spread spectrum control of the switching frequency. The integrators 202, 204 may be clamped at, for example, 1% total harmonic distortion in the case of loop filter saturation (i.e., clipping). Smooth recovery from saturation may be provided by the first and second order feedback derived from the output of the filter 214 so that the amplifier 200 is stable if the integrators 202, 204 are saturated or clamped by an active clamp circuit.

The integrators 202, 204 may include clamping that clamps the integrators 202, 204 to a voltage that is a selected fraction of the power supply voltage. Accordingly, the integrators 202, 204 may not provide excessive voltage to the summing amplifier 208 and integrator 202, 204 clipping may be easily detected.

Figure 3:
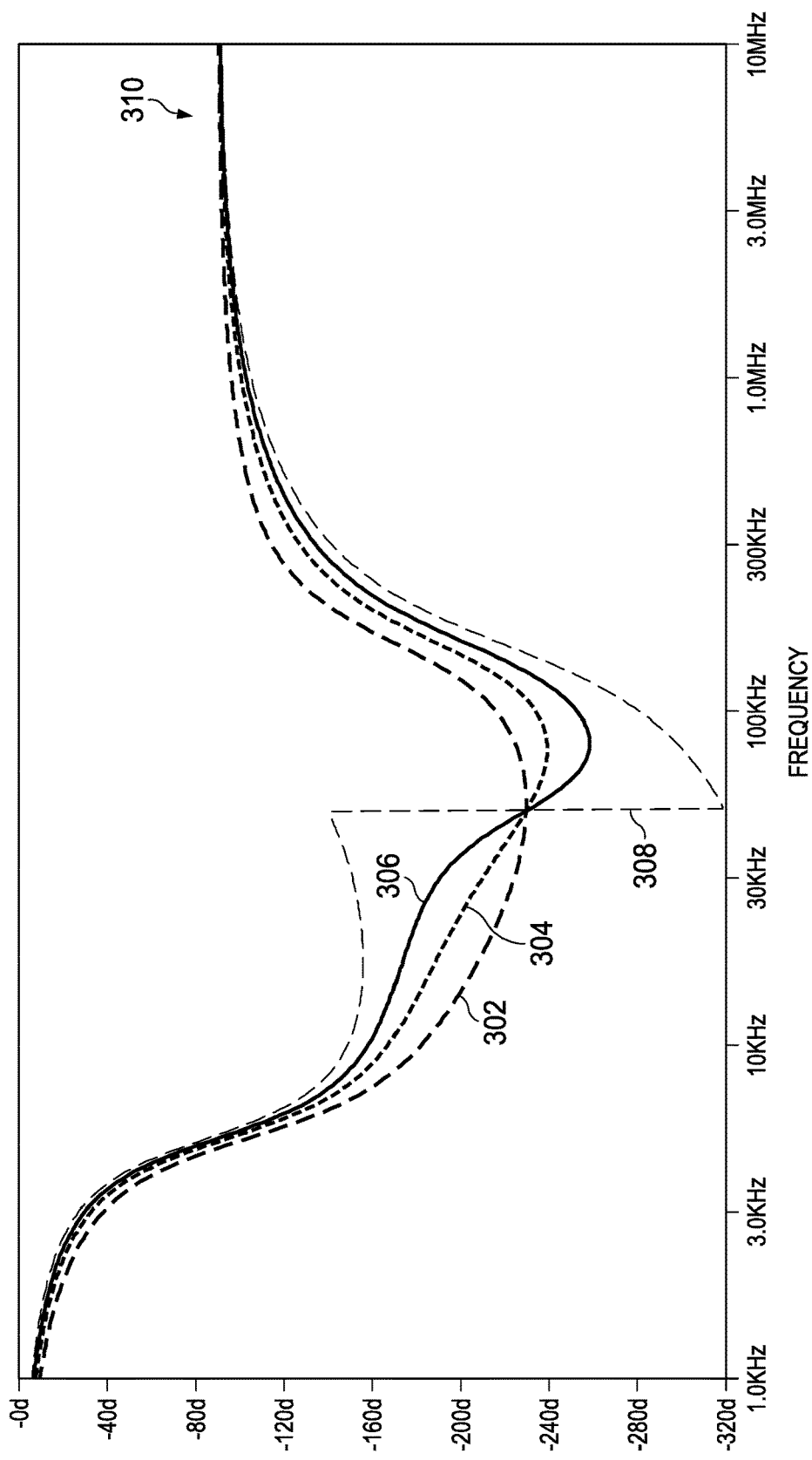
FIG. 3 shows phase response of a class-D audio amplifier in accordance with various embodiments.

FIG. 3 shows phase response of various embodiments of the class-D audio amplifier 100. In FIG. 3, phase response of the amplifier 100 is shown with a two ohm output load, a four ohm output load, an eight ohm output load, and no output load (i.e., open). Response curve 302 shows phase response of the amplifier 100 with the two ohm output load. Response curve 304 shows phase response of the amplifier 100 with the four ohm output load. Response curve 306 shows phase response of the amplifier 100 with the eight ohm output load. Response curve 308 shows phase response of the amplifier 100 with the output open. The phase shift at the various output loads asymptotically approaches 90 degrees at high frequencies.

Figure 4:
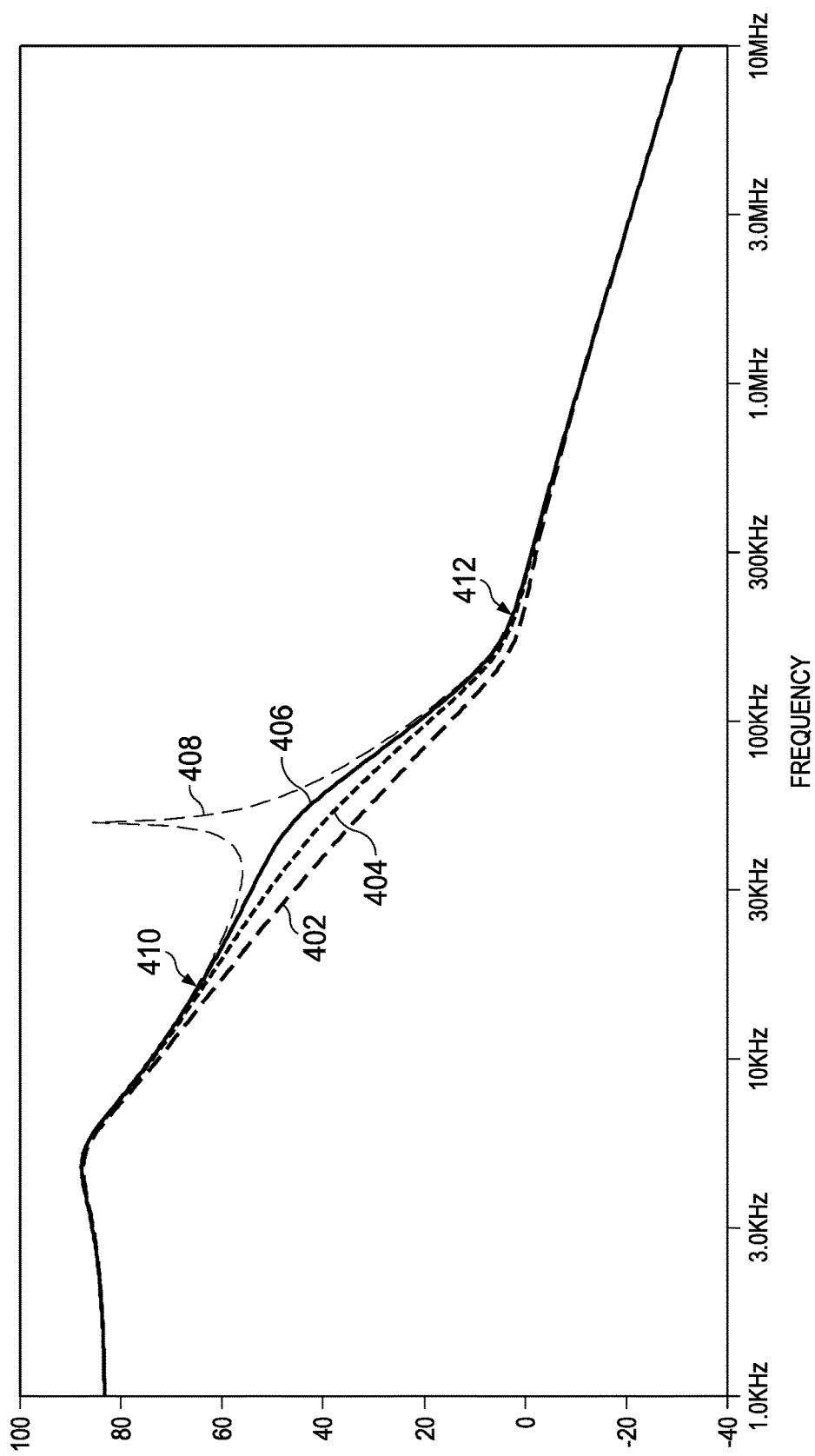
FIG. 4 shows loop gain of a class-D audio amplifier in accordance with various embodiments.

FIG. 4 shows loop gain of various embodiments of the class-D audio amplifier 100. In FIG. 4, loop gain of the amplifier 100 is shown with a two ohm output load, a four ohm output load, an eight ohm output load, and no load (i.e., open). Response curve 402 shows loop gain of the amplifier 100 with the two ohm output load. Response curve 404 shows loop gain of the amplifier 100 with the four ohm output load. Response curve 406 shows loop gain of the amplifier 100 with the eight ohm output load. Response curve 308 shows loop gain of the amplifier 100 with the output open. At 410 the loop gain is about 60 decibels and the frequency is approximately 20 kilohertz. Thus, the embodiment of the amplifier 100 represented in FIG. 4 provides at least 60 decibels, of open loop gain over the entire audio band (e.g., 20 hertz to 20 kilohertz). At 412 the loop gain is about 0 decibels and the frequency is approximately 260 kilohertz.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A class-D amplifier, comprising:
    an L-C filter;
    an output driver, wherein an output terminal of the output driver is coupled to an input terminal of the L-C filter;
    a second order filter; and
    a summing amplifier;
    wherein:
        a first input terminal of the summing amplifier is coupled to an output terminal of the L-C filter; and
    a second input terminal of the summing amplifier is coupled to a first output terminal of the second order filter;
        further comprising a differentiator, wherein a third input terminal of the summing amplifier is coupled to the output terminal of the L-C filter via the differentiator.

2. A class-D amplifier, comprising:
    an L-C filter;
    an output driver, wherein an output terminal of the output driver is coupled to an input terminal of the L-C filter;
    a second order filter; and
    a summing amplifier;
    wherein:
        a first input terminal of the summing amplifier is coupled to an output terminal of the L-C filter; and
    a second input terminal of the summing amplifier is coupled to a first output terminal of the second order filter;
        wherein a third input terminal of the summing amplifier is coupled to a second output terminal of the second order filter.

3. The class-D amplifier of claim 2, wherein the second order filter comprises a first filter stage and a second filter stage, wherein the first output terminal of the second order filter is an output of the first stage and the second output terminal of the second order filter is an output of the second stage.

4. A class-D amplifier, comprising:
an L-C filter;
an output driver, wherein an output terminal of the output driver is coupled to an input terminal of the L-C filter;
a second order filter; and
a summing amplifier;
wherein:
a first input terminal of the summing amplifier is coupled to an output terminal of the L-C filter; and
a second input terminal of the summing amplifier is coupled to a first output terminal of the second order filter;
wherein a first input terminal of the second order filter is coupled to the output terminal of the L-C filter.

5. A class-D amplifier, comprising:
an L-C filter;
an output driver, wherein an output terminal of the output driver is coupled to an input terminal of the L-C filter;
a second order filter; and
a summing amplifier;
wherein:
a first input terminal of the summing amplifier is coupled to an output terminal of the L-C filter; and
a second input terminal of the summing amplifier is coupled to a first output terminal of the second order filter;
further comprising a signal input terminal coupled to a first input terminal of the second order filter and a third input terminal of the summing amplifier.

6. A class-D amplifier, comprising:
an L-C filter;
an output driver, wherein an output terminal of the output driver is coupled to an input terminal of the L-C filter;
a second order filter; and
a summing amplifier;
wherein:
a first input terminal of the summing amplifier is coupled to an output terminal of the L-C filter; and
a second input terminal of the summing amplifier is coupled to a first output terminal of the second order filter;
wherein the L-C filter, the second order filter and the summing amplifier are connected to form a loop filter that provides at least 60 decibels of gain over a frequency range of 20 Hertz to 20 kilo-Hertz.

7. An audio amplifier integrated circuit, comprising:
an output driver configured to drive a speaker coil through an L-C filter;
an output terminal to couple the output driver to an input side of the L-C filter; and
a first input terminal to couple an output side of the L-C filter to the integrated circuit;
a second order filter comprising:
a first filter stage; and
a second filter stage coupled to an output of the first filter stage; and
a summing amplifier comprising:
a first input coupled to the first input terminal;
a second input coupled to an output of the second filter stage.

8. The audio amplifier integrated circuit of claim 7, further comprising a differentiator, wherein the summing amplifier comprises a third input coupled to the first input terminal via the differentiator.

9. The audio amplifier integrated circuit of claim 7, wherein the summing amplifier comprises a third input coupled to an output of the first filter stage.

10. The audio amplifier integrated circuit of claim 7, wherein the first filter stage comprises an input coupled to the first input terminal.

11. The audio amplifier integrated circuit of claim 7, further comprising a second input terminal to couple an audio signal to the integrated circuit, wherein the second input terminal is coupled to a third input of the summing amplifier and to an input of the first filter stage.

12. The audio amplifier integrated circuit of claim 7, wherein the second filter stage comprises an input coupled to a clock signal that sets a modulation frequency of the audio amplifier integrated circuit.

13. The audio amplifier integrated circuit of claim 7, wherein the second order filter, and the summing amplifier are configured to cooperate with the L-C filter to form a loop filter that provides at least 60 decibels of gain over a frequency range of 20 Hertz to 20 kilo-Hertz.

14. An integrated circuit, comprising:
a class-D audio amplifier, comprising:
an output driver configured to drive a speaker coil through an L-C filter;
an output terminal to couple the output driver to an input side of the L-C filter; and
a first input terminal to couple an output side of the L-C filter to the integrated circuit;
a second order filter comprising:
a first filter stage coupled to the first input terminal; and
a second filter stage coupled to an output of the first filter stage;
a summing amplifier comprising:
a first input coupled to the first input terminal;
a second input coupled to an output of the second filter stage; and
a differentiator coupled to the first input terminal and to a third input of the summing amplifier.

15. The integrated circuit of claim 14, wherein the summing amplifier comprises a fourth input coupled to an output of the first filter stage.

16. The integrated circuit of claim 14, wherein the class-D audio amplifier further comprises a second input terminal to receive an audio signal to be amplified, wherein the second input terminal is coupled to a fourth input of the summing amplifier and to an input of the first filter stage.

17. The integrated circuit of claim 14, wherein the second filter stage comprises an input coupled to a clock signal that sets a modulation frequency of the class-D audio amplifier.

18. The integrated circuit of claim 14, wherein the second order filter and the summing amplifier are configured to cooperate with the L-C filter to form a loop filter that provides at least 60 decibels of gain over a frequency range of 20 Hertz to 20 kilo-Hertz.

* * * * *